US006815486B2

(12) United States Patent
Bhagwagar et al.

(10) Patent No.: US 6,815,486 B2
(45) Date of Patent: Nov. 9, 2004

(54) THERMALLY CONDUCTIVE PHASE CHANGE MATERIALS AND METHODS FOR THEIR PREPARATION AND USE

(75) Inventors: Dorab Edul Bhagwagar, Saginaw, MI (US); Andrew Anthony Mojica, Freeland, MI (US); Kimmai Thi Nguyen, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 113 days.

(21) Appl. No.: 10/122,526

(22) Filed: Apr. 12, 2002

(65) Prior Publication Data

US 2003/0194537 A1 Oct. 16, 2003

(51) Int. Cl.[7] .............................................. C08K 3/22
(52) U.S. Cl. ........................ 524/430; 524/588; 524/433; 524/437; 524/432; 524/404; 524/406; 524/424; 524/413
(58) Field of Search .................................. 524/588, 433, 524/437, 432, 404, 406, 424, 413, 430

(56) References Cited

U.S. PATENT DOCUMENTS

| | | | |
|---|---|---|---|
| 4,193,885 A | 3/1980 | Halm | 252/78.3 |
| 4,282,346 A | 8/1981 | Sharkey | 528/338 |
| 4,299,715 A | 11/1981 | Whitfield et al. | 252/74 |
| 4,501,861 A | 2/1985 | Woodbrey | 525/421 |
| 4,517,342 A | 5/1985 | Ryang | 525/431 |
| 4,558,110 A | 12/1985 | Lee | 528/26 |
| 4,604,442 A | 8/1986 | Rich | 528/28 |
| 4,631,329 A | 12/1986 | Gornowicz et al. | 528/28 |
| 4,793,555 A | 12/1988 | Lee et al. | 239/6 |
| 4,820,446 A * | 4/1989 | Prud'Homme | 252/511 |
| 4,822,523 A * | 4/1989 | Prud'Homme | 252/511 |
| RE33,141 E | 1/1990 | Gornowicz et al. | 528/28 |
| 4,959,752 A * | 9/1990 | Samarov et al. | 361/818 |
| 5,298,589 A | 3/1994 | Buese et al. | 528/21 |
| 5,347,028 A | 9/1994 | Buese et al. | 556/460 |
| 5,357,022 A | 10/1994 | Banach et al. | 528/29 |
| 5,773,561 A * | 6/1998 | Sachdev et al. | 528/353 |
| 5,904,796 A | 5/1999 | Freuler et al. | 156/278 |
| 5,912,805 A | 6/1999 | Freuler et al. | 361/705 |
| 5,929,164 A | 7/1999 | Zhang | 524/862 |
| 5,930,893 A | 8/1999 | Eaton | 29/890.03 |
| 5,950,066 A | 9/1999 | Hanson et al. | 428/551 |
| 5,981,680 A * | 11/1999 | Petroff et al. | 528/26 |
| 6,051,216 A * | 4/2000 | Barr et al. | 424/78.35 |
| 6,054,198 A | 4/2000 | Bunyan et al. | 428/40.5 |
| 6,169,142 B1 | 1/2001 | Nakano et al. | 524/862 |
| 6,197,859 B1 | 3/2001 | Green et al. | 524/270 |
| 6,286,212 B1 | 9/2001 | Eaton | 29/890.03 |
| 6,433,055 B1 * | 8/2002 | Kleyer et al. | 524/379 |
| 6,433,057 B1 | 8/2002 | Bhagwagar et al. | 524/403 |
| 6,442,365 B1 * | 8/2002 | Schlueter et al. | 399/328 |
| 6,620,515 B2 * | 9/2003 | Feng et al. | 428/447 |

FOREIGN PATENT DOCUMENTS

| | | | |
|---|---|---|---|
| EP | 1117771 | 6/1968 | |
| EP | 0540273 A1 | 10/1992 | ........... C08G/77/46 |
| EP | 0 987 757 A2 | 3/2000 | ......... H01L/23/367 |
| EP | 1 067 164 A1 | 1/2001 | ............ C09K/5/06 |
| EP | 1097957 A1 | 5/2001 | ......... C08G/77/455 |
| JP | 2002-329989 | 11/2002 | |
| WO | WO 01/68363 A1 | 9/2001 | ........... B32B/27/08 |

OTHER PUBLICATIONS

The Polymeric Materials Encyclopedia, "Siloxane–Containing Polymers", Bogdan Simionescu, Valeria Harabagiu and Cristofer Simionescu, CRC Press, Inc. 1996.

Thermal Trends, "Parameter Optimization for Measuring Thermal Properties of Electronic Materials Using the Transient Plane Source Technique", Craig Dixon, Michael Strong and S. mark Zhang, vol. 7, No. 5, p. 1.

Thermoplastic Elastomers, A Complete Review, "Research on Thermoplastic Elastomers", James E. McGrath, Hanser Publishers, 1987.

"Polymer Bulletin", I. Yilgor, J.S. Riffle, G.L. Wilkes and J.E. McGrath, 8, 535–542, 1982.

U.S. patent application Ser. No. 09/903,920, Cook et al., filed Jul. 12, 2001.

ITherm abstract submission, "Silicone Organic Phase Change Materials for TIM", Mark Zhang, Diane Swarthout and Jane Feng.

ITherm abstract submission, "Novel Silcone Based Phase Change Thermal Interface Materials", Dorab Bhagwagar, Kimmai Nguyen and Andrew Mojica.

Zhang, Swarthout, Fend, Petroff, Noll, Gelderbloom, Houtman and Wall, "Alkyl Methyl Silicone Phase Change Materials for Thermal Interface Applications."

American Chemical Society, "Effect of Stabilization of Polypropylene During Processing and Its Influence on Long-–Term Behavior Under Thermal Stress", Polymer Durability, Ciba–Geigy AG, Basel, Switzerland, vol. 25, pp. 375–396, 1996.

Encyclopedia of Polymer Science and Engineering, Scattering to Structural Foams, "Silicones", pp. 242–245, 298–308, vol. 15, Abstract EP 1 101 167, May 23, 2001.

Abstract JP 63–230781, Sep. 27, 1988.

* cited by examiner

Primary Examiner—Margaret G. Moore
(74) Attorney, Agent, or Firm—Catherine U. Brown

(57) ABSTRACT

A phase change composition comprises: a matrix comprising a silicone-organic block copolymer, and a thermally conductive filler. The composition can be used as a thermal interface material in electronic devices. The composition is formulated to have any desired phase change temperature.

26 Claims, 2 Drawing Sheets

THERMALLY CONDUCTIVE PHASE CHANGE MATERIALS AND METHODS FOR THEIR PREPARATION AND USE

FIELD OF THE INVENTION

This invention relates to a thermally conductive phase change composition (PCC) and methods for preparation and use of the PCC. More particularly, this invention relates to a PCC comprising an silicone-organic block copolymer and a thermally conductive filler. The PCC can be used as a thermal interface material (TIM).

BACKGROUND

Electronic components such as semiconductors, transistors, integrated circuits (ICs), discrete devices, and others known in the art are designed to operate at a normal operating temperature or within a normal operating temperature range. However, the operation of an electronic component generates heat. If sufficient heat is not removed, the electronic component will operate at a temperature significantly above its normal operating temperature. Excessive temperatures can adversely affect performance of the electronic component and operation of the device associated therewith and negatively impact mean time between failures.

To avoid these problems, heat can be removed by thermal conduction from the electronic component to a heat sink. The heat sink can then be cooled by any convenient means such as convection or radiation techniques. During thermal conduction, heat can be transferred from the electronic component to the heat sink by surface contact between the electronic component and the heat sink or by contact of the electronic component and heat sink with a TIM. The lower the thermal impedance of the medium, the greater the flow of heat from the electronic component to the heat sink.

Surfaces of the electronic component and the heat sink are typically not completely smooth, therefore, it is difficult to achieve full contact between the surfaces. Air spaces, which are poor thermal conductors, appear between the surfaces and increase impedance. These spaces can be filled by inserting a TIM between the surfaces.

Some commercially available TIMs are organic polymers or elastomers filled with thermally conductive fillers. However, elastomers suffer from the drawbacks that they may be difficult to apply in an uncured state, and they may not fully adhere or mesh with the surfaces if cured before application. Polymers suffer from the drawback that they can flow out of the spaces after application. Some polymers may also suffer from the drawback that they lack sufficient thermal conductivity.

Silicone greases with conductive fillers have also been proposed as TIMs. However, greases suffer from the drawbacks that they can be messy to apply and can flow out of the spaces after application.

PCCs have been proposed for use as TIMs. PCCs are advantageous in solving the above problems because they can be formulated to be a solid at low temperatures and deformable at a phase change temperature. The phase change temperature can be equal to or above the normal operating temperature of the electronic component.

PCCs can comprise organic materials such as waxes, and conductive fillers. However, organic waxes suffer from the drawback that they can flow out of the spaces after application, during operation of the electronic component. Organic waxes may also be brittle at room temperature.

SUMMARY OF THE INVENTION

This invention relates to a phase change composition (PCC) and methods for its preparation and use. The PCC comprises a matrix and a thermally conductive filler. The matrix comprises a silicone-organic block copolymer.

DETAILED DESCRIPTION OF THE PREFERRED EMBODIMENTS

Figure 1:
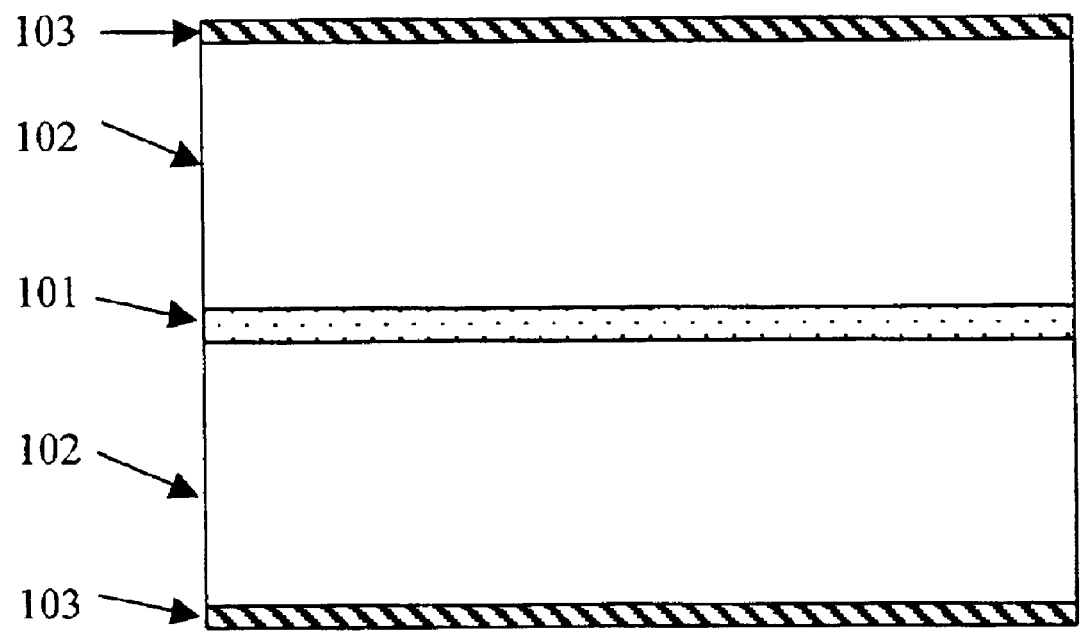
FIG. 1 is an interface material according to this invention.

All amounts, ratios, and percentages are by weight unless otherwise indicated. The following is a list of definitions, as used herein.

Definitions and Usage of Terms

"A" and "an" each mean one or more.

"Alkyl" means a saturated hydrocarbon group.

"Combination" means two or more items put together by any method.

"Copolymer" means a polymer made from at least two distinct monomers. Copolymer includes, but is not limited to, polymers made from only two distinct monomers.

"Phase change temperature" means a temperature or temperature range evidencing a transition from a solid, crystalline, or glassy phase to a semi-solid phase, which can be characterized as exhibiting intermolecular chain rotation.

"Silicone-organic block copolymer" means a material having at least one Si—O—Si—R—Si linkage in its backbone, where R represents an organic group.

"Substituted" means one or more hydrogen atoms bonded to a carbon atom has been replaced with another substituent.

"Surface treated" means that all, or a portion of, reactive groups on a filler particle have been rendered less reactive by any convenient chemical or unreactive means.

PCC

This invention relates to a phase change composition (PCC). The PCC comprises:

A) a matrix comprising a silicone-organic block copolymer,

B) a thermally conductive filler, optionally C) a treating agent, and optionally D) an antioxidant.

The PCC is formulated to have a phase change temperature.

Matrix

Component A) is a matrix that binds the components in the PCC. Component A) comprises a silicone-organic block copolymer. The PCC can comprise at least 4%, alternatively at least 5% of component A). The PCC can comprise up to 60% of component A), alternatively up to 50%, alternatively up to 20%, alternatively up to 10%. Silicone-organic block copolymers are known in the art and commercially available.

Suitable silicone-organic block copolymers include silicone acrylate block copolymers, silicone-amide block copolymers, silicone-epoxy block copolymers, silicone-ether block copolymers, silicone-imide block copolymers, silicone-styrene block copolymers, silicone-urethane block copolymers, silicone-urea block copolymers, siliconevinylether block copolymers, combinations thereof, and others. Silicone-organic block copolymers and methods for their preparation are known in the art, see for example, Bogdan C. Simionescu, Valeria Harabagiu and Cristofor I. Simionescu, "Siloxane-Containing Polymers" in The Polymeric Materials Encyclopedia, CRC Press, Inc., 1996; James E. McGrath, "Research on Thermoplastic Elastomers" in *Thermoplastic Elastomers, A Comprehensive Review*, Edited by N. R. Legge, G. Holden, H. E. Schroeder, Hanser Publishers, 1987; Bruce Hardman and Arnold Torkelson, "Silicones" in *Encyclopedia of Polymer Science and Engineering*, Edited by H. F. Mark, N. M. Bikales, C. G. Overberger, G. Menges, J. I. Kroschwitz, John Wiley & Sons, 1989, vol. 15, page 243; and I. Yilgor, J. S. Riffle, G. L. Wilkes and J. E. McGrath, "Polymer Bulletin", 8, 535–542 (1982). Silicone-organic block copolymers and methods for their preparation can also be found in U.S. Pat. Nos. Re. 33,141; 4,558,110; 4,631,329; and 4,793,555. Silicone-urethane block copolymers and silicone-amide block copolymers and methods for their preparation are disclosed in U.S. Pat. Nos. 4,501,861; 4,604,442; 5,981,680; and 6,051,216.

Silicone-amide block copolymers are exemplified by those comprising units of Formula I:

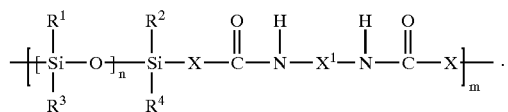

Subscript n represents an average value for degree of polymerization of the siloxane units as shown in Formula I with this average being a number average based on all the siloxane segments in all units in Formula I. Variation in individual n values is possible. Subscript n is at least 1, alternatively at least 10, alternatively at least 12, alternatively at least 15. Subscript n is up to 700, alternatively up to 500, alternatively up to 50, alternatively up to 45, alternatively up to 30, alternatively up to 18.

Subscript m is at least 1, alternatively at least 4, alternatively at least 45, alternatively at least 55, alternatively at least 60. Subscript m can be up to 300, alternatively up to 200, alternatively up to 125, alternatively up to 80. Without wishing to be bound by theory, it is thought that increasing the value of m increases the melt viscosity of the silicone-organic block copolymer, and consequently the melt viscosity of the PCC (the viscosity of the PCC when heated above its phase change temperature). The upper limit of m may be limited to a value that provides a melt viscosity that allows the PCC to comply and wet-out the substrate on which the PCC will be applied under operating temperature and pressure conditions.

X is a divalent hydrocarbon group. X may be branched or linear. X may be saturated. X has at least 1 carbon atom, alternatively at least 3 carbon atoms. X can have up to 30 carbon atoms, alternatively up to 10 carbon atoms.

$X^1$ is a divalent organic group. $X^1$ can be a divalent hydrocarbon group. Divalent hydrocarbon groups for $X^1$ can be branched or linear. Divalent hydrocarbon groups for $X^1$ have at least 1 carbon atom, alternatively at least 2 carbon atoms. Divalent hydrocarbon groups for $X^1$ have up to 40 carbon atoms, alternatively up to 20 carbon atoms, alternatively up to 10 carbon atoms, alternatively up to 6 carbon atoms.

Divalent hydrocarbon groups for $X^1$ may be unsubstituted or substituted. Divalent hydrocarbon groups for $X^1$ may be substituted by, for example, at least one of (i) hydroxy; (ii) a cycloalkyl group of 3 to 8 carbon atoms; (iii) 1 to 3 members each independently selected from alkyl groups of 1 to 3 carbon atoms, unsubstituted phenyl groups, and phenyl groups substituted by 1 to 3 members each independently selected from alkyl groups of 1 to 3 carbon atoms; (iv) a hydroxyalkyl group of 1 to 3 carbon atoms; and (v) an alkyl amino group of 1 to 6 carbon atoms.

Divalent organic groups for $X^1$ may comprise a hydrocarbon chain containing at least one of (i) 1 to 3 amide linkages; (ii) a cyclic, divalent, saturated hydrocarbon group of 5 or 6 carbon atoms; and (iii) a phenylene optionally substituted by 1 to 3 members selected each independently from alkyl groups of 1 to 3 carbon atoms.

$X^1$ can be a group of the formula $R^{20}T(R^{21})R^{22}$, where $R^{20}$ and $R^{22}$ are divalent hydrocarbon groups of 1 to 10 carbon atoms and $R^{21}$ is a monovalent or divalent hydrocarbon group of 1 to 10 carbon atoms, such groups being independent of one another, and T is C(R), where R can be hydrogen, $R^1$, $R^2$, $R^3$, $R^4$, or a trivalent N, P or Al; the divalencies and trivalencies herein should be understood and taken to allow for branching, cross linking or the like in certain instances and as appropriate.

Each of $R^1$, $R^2$, $R^3$, and $R^4$ is independently methyl, ethyl, propyl, isopropyl, a halogenated alkyl group such as trifluoropropyl, a chain comprising siloxane (such as a polydimethylsiloxane or a siloxane based polyamide), and phenyl, wherein the phenyl may optionally be substituted by 1 to 3 members independently selected from methyl and ethyl. Alternatively, each of $R^1$, $R^2$, $R^3$, and $R^4$ is selected from methyl and ethyl. Alternatively, each of $R^1$, $R^2$, $R^3$, and $R^4$ is methyl.

The individual values for X, $X^1$, n, $R^1$, $R^2$, $R^3$, and $R^4$ may be the same or different for each unit of the silicone-amide block copolymer (which may include those between any of the m units of Formula I). Such variation may or may not also exist for the X groups within each of the m units of Formula I. Individual $X^1$ groups may be aliphatic, aromatic or both.

When used in reference to Formula I, and unless otherwise indicated, the term "siloxane group" refers to a group having siloxane units such as:

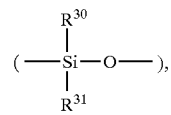

where, $R^{30}$ and $R^{31}$ are each independently selected from organic moieties, and each of $R^{30}$ and $R^{31}$ are connected to the silicon by a carbon-silicon bond. Further, in Formula I, the carbon numbers in X and $X^1$ do not include the carbons in any optional segments or substitutions. Also, the silicone-amide block copolymers have a siloxane portion in the backbone and optionally may have a siloxane portion in a pendant or branched portion.

Acceptable variations of the Formula I include: (1) silicone-amide block copolymers in which multiple values of n, X, $X^1$, $R^1$, $R^2$, $R^3$, and $R^4$ occur in one polymeric molecule (which may include variation between the m units of Formula I and even within X groups), wherein the sequencing of these units may be alternating, random or block; (2) silicone-amide block copolymers in which an organic triamine or higher amine such as tris(2-aminoethyl) amine replaces the organic diamine in part, to produce a branched or cross linked molecule; and (3) physical blends of any of (1) and (2) or alternating block copolymers, or combinations thereof.

Formula I represents an alternating block copolymer or $(AB)_m$ type copolymer. Depending on how the copolymer of Formula I is endblocked, Formula I can represent a $B(AB)_m$ or a $A(BA)_m$ type copolymer. Formula I may be endblocked with an amide group, a tri-substituted silicone group, or both.

Suitable silicone-amide block copolymers for use in this invention may also comprise units of Formula II:

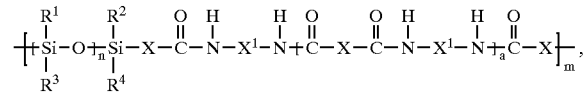

where $X, X^1, R^1, R^2, R^3, R^4$, n, and m are as defined above for Formula I. The molar ratio of a/m is at least 0.1. Subscript a represents an average value for degree of chain extension by condensation chemistry of the amide segment. If subscript a is 0 then the structure of Formula II reverts to Formula I. Subscript a is at least 1, alternatively at least 2, alternatively at least 10. Subscript a is up to 60, alternatively up to 55. Variation in individual a values is possible. Formula II represents an alternating block copolymer or $(AB)_m$ type copolymer. Depending on how the copolymer of Formula II is endblocked, Formula II can represent a $B(AB)_m$ or a $A(BA)_m$ type copolymer. Formula II may be endblocked with an amide group, a tri-substituted silicone group, or both.

The silicone-amide block copolymers of Formula II can be prepared by modifying a diamide first using the condensation chemistry as described in JP 63230781, WO 2001/68363, and U.S. Pat. No. 4,282,346; followed by the processes described above in U.S. Pat. Nos. 5,981,680 and 6,051,216. Silicone-amide block copolymers of Formula II can be prepared by one of ordinary skill in the art without undue experimentation using the method set forth in Example 7, below by varying appropriate starting materials.

It should be understood that the disclosure of ranges herein should be taken not only to disclose the range itself but also anything subsumed therein, as well as endpoints. For example, disclosure of a range of 1 to 10 should be understood to disclose not only the range of 1 to 10, but also 1, 2.7, 9 and 10 individually, as well as any other number subsumed in the range. Similarly, disclosure of a range of hydrocarbons of 1 to 5 carbon atoms should be understood to disclose not only hydrocarbons of 1 to 5 carbon atoms as a class, but also hydrocarbons of 1 carbon atom, hydrocarbons of 2 carbon atoms, hydrocarbons of 3 carbon atoms, hydrocarbons of 4 carbon atoms and hydrocarbons of 5 carbon atoms individually.

Without wishing to be bound by theory, it is thought that the silicone-organic block copolymers essentially form "thermoplastic gels." The organic ("hard") segments essentially serve as thermoplastic (reversible) crosslink sites and dictate the softening point or phase change temperature of the silicone-organic block copolymer, while the silicone ("soft") segments impart flexibility and elasticity. The ratios of hard and soft segments can be deliberately chosen such that the silicone-organic block copolymer is soft and more gel-like in character at room temperature as compared to a traditional thermoplastic elastomer. The architecture of the silicone-organic block copolymer chain, the chemical nature and length of the hard segments and the length of the soft segments affect the phase change temperature, the melt viscosity, and the room temperature modulus. It is also understood that other hard segments such as acrylates, epoxy, ester, ether, and others can be used in conjunction with the soft segments to form silicone-organic block copolymers with similar "thermoplastic gel" properties.

Filler

Component B) is a thermally conductive filler. Component B) is dispersed in component A). The amount of component B) in the PCC depends various factors including the material selected for component A), the material selected for component B), and the desired phase change temperature of the PCC. The amount of component B) can be at least 40% of the PCC, alternatively at least 50% of the PCC, alternatively at least 85% of the PCC. The amount of component B) can be up to 96%, alternatively up to 95% of the PCC. If the amount of component B) is too low, the PCC may have insufficient thermal conductivity for some applications. The exact amount of thermally conductive filler for component B) will depend on various factors including the density and thermal conductivity of the thermally conductive filler selected.

Component B) can be thermally conductive, electrically conductive, or both. Alternatively, component B) can be thermally conductive and electrically insulating. Suitable thermally conductive fillers for component B) include metal particles, metal oxide particles, and a combination thereof. Suitable thermally conductive fillers for component B) are exemplified by aluminum nitride; aluminum oxide; barium titinate; beryllium oxide; boron nitride; diamond; graphite; magnesium oxide; metal particulate such as copper, gold, nickel, or silver; silicon carbide; tungsten carbide; zinc oxide, a combination thereof, and others.

Thermally conductive fillers are known in the art and commercially available, see for example, U.S. Pat. No. 6,169,142 (col. 4, lines 7–33). For example, CB-A20S and Al-43-Me are aluminum oxide fillers of differing particle sizes commercially available from Showa-Denko, and AA-04, AA-2, and AA18 are aluminum oxide fillers commercially available from Sumitomo Chemical Company.

Silver filler is commercially available from Metalor Technologies U.S.A. Corp. of Attleboro, Mass., U.S.A. Boron nitride filler is commercially available from Advanced Ceramics Corporation, Cleveland, Ohio, U.S.A.

The shape of the filler particles is not specifically restricted, however, rounded or spherical particles may prevent viscosity increase to an undesirable level upon high loading of the filler in the PCC.

A combination of fillers having differing particle sizes and different particle size distributions may be used as component B). For example, it may be desirable to combine a first aluminum oxide having a larger average particle size with a second aluminum oxide having a smaller average particle size in a proportion meeting the closest packing theory distribution curve. This improves packing efficiency and may reduce viscosity and enhance heat transfer.

The average particle size of the filler will depend on various factors including the type of filler selected for component B) and the exact amount added to the PCC, however, the filler can have an average particle size of at least 0.2 micrometers, alternatively at least 2 micrometers. The filler can have an average particle size of up to 80 micrometers, alternatively up to 50 micrometers.

The filler for component B) may optionally be surface treated with component C) a treating agent. Treating agents and treating methods are known in the art, see for example, U.S. Pat. No. 6,169,142 (col. 4, line 42 to col. 5, line 2).

The PCC may comprise at least 0.05% of component C). The PCC may comprise up to 5%, alternatively up to 0.5%, of component C).

The treating agent can be an alkoxysilane having the formula: $R^5_xSi(OR^6)_{(4-x)}$, where x is 1, 2, or 3; alternatively x is 3. $R^5$ is a substituted or unsubstituted monovalent hydrocarbon group of at least 1 carbon atom, alternatively at least 8 carbon atoms. $R^5$ has up to 50 carbon atoms, alternatively up to 30 carbon atoms, alternatively up to 18 carbon atoms. $R^5$ is exemplified by alkyl groups such as hexyl, octyl, dodecyl, tetradecyl, hexadecyl, and octadecyl; and aromatic groups such as benzyl, phenyl and phenylethyl. $R^5$ can be saturated or unsaturated, branched or unbranched, and unsubstituted. $R^5$ can be saturated, unbranched, and unsubstituted.

$R^6$ is an unsubstituted, saturated hydrocarbon group of at least 1 carbon atom. $R^6$ may have up to 4 carbon atoms, alternatively up to 2 carbon atoms. Component C) is exemplified by hexyltrimethoxysilane, octyltriethoxysilane, decyltrimethoxysilane, dodecyltrimethyoxysilane, tetradecyltrimethoxysilane, phenyltrimethoxysilane, phenylethyltrimethoxysilane, octadecyltrimethoxysilane, octadecyltriethoxysilane, a combination thereof, and others.

Alkoxy-functional oligosiloxanes can also be used as treatment agents. Alkoxy-functional oligosiloxanes and methods for their preparation are known in the art, see for example, EP 1 101 167 A2. For example, suitable alkoxy-functional oligosiloxanes include those of the formula $(R^9O)_dSi(OSiR^7_2R^8)_{4-d}$. In this formula, d is 1, 2, or 3, alternatively d is 3. Each $R^7$ is can be independently selected from saturated and unsaturated monovalent hydrocarbon groups of 1 to 10 carbon atoms. Each $R^8$ can be a saturated or unsaturated monovalent hydrocarbon group having at least 11 carbon atoms. Each $R^9$ can be an alkyl group.

Metal fillers can be treated with alkylthiols such as octadecyl mercaptan and others, and fatty acids such as oleic acid, stearic acid, titanates, titanate coupling agents, zirconate coupling agents, a combination thereof, and others.

Treatment agents for alumina or passivated aluminum nitride could include alkoxysilyl functional alkylmethyl polysiloxanes (e.g., partial hydrolysis condensate of $R^{10}_bR^{11}_cSi(OR^{12})_{(4-b-c)}$ or cohydrolysis condensates or mixtures), similar materials where the hydrolyzable group would be silazane, acyloxy or oximo. In all of these, a group tethered to Si, such as $R^{10}$ in the formula above, is a long chain unsaturated monovalent hydrocarbon or monovalent aromatic-functional hydrocarbon. $R^{11}$ is a monovalent hydrocarbon group, and $R^{12}$ is a monovalent hydrocarbon group of 1 to 4 carbon atoms. In the formula above, b is 1, 2, or 3 and c is 0, 1, or 2, with the proviso that b+c is 1, 2, or 3. One skilled in the art could optimize a specific treatment to aid dispersion of the filler without undue experimentation.

Other Optional Components

Component B), the thermally conductive filler, may optionally comprise a reinforcing filler in addition to the thermally conductive filler, or instead of a portion of the thermally conductive filler. The reinforcing filler can be a chopped fiber, such as chopped KEVLAR®. Without wishing to be bound by theory, it is thought that chopped KEVLAR® improves strength and coefficient of thermal expansion (CTE). Reinforcing fillers may also be treated with component C).

Optional component D) is an antioxidant. Without wishing to be bound by theory, it is thought that component D) prevents chain cleavage of the silicone-organic block copolymer typically by scavenging free radicals. Component D) can comprise any antioxidant commonly used in plastics. Component D) can be added to the PCC in an amount of at least 0.001%, alternatively at least 0.05% up to 1%.

Suitable antioxidants are known in the art and are commercially available. Suitable antioxidants include phenolic antioxidants and combinations of phenolic antioxidants with stabilizers. Phenolic antioxidants include fully sterically hindered phenols and partially hindered phenols. Stabilizers include organophosphorous derivatives such as trivalent organophosphorous compound, phosphites, phosphonates, and a combination thereof; thiosynergists such as organosulfur compounds including sulfides, dialkyldithiocarbamate, dithiodipropionates, and a combination thereof; and sterically hindered amines such as tetramethyl-piperidine derivatives. Suitable antioxidants and stabilizers are disclosed in Zweifel, Hans, "Effect of Stabilization of Polypropylene During Processing and Its Influence on Long-Term Behavior under Thermal Stress," *Polymer Durability*, Ciba-Geigy AG, Additives Division, CH-4002, Basel, Switzerland, American Chemical Society, vol. 25, pp. 375–396, 1996.

Suitable phenolic antioxidants include vitamin E and IRGANOX® 1010 from Ciba Specialty Chemicals, U.S.A. IRGANOX® 1010 comprises pentaerythriol tetrakis(3-(3,5-di-t-butyl-4-hydroxyphenyl)propionate).

Optional component E) is a catalyst inhibitor. Component E) can be an addition reaction catalyst inhibitor. Addition reaction catalyst inhibitors are known in the art and commercially available, see for example, U.S. Pat. No. 5,929,164 (col. 1, line 65 to col. 3, line 65).

Component E) can be a phosphine, a diphosphine, an amine, a diamine, a triamine, an organic sulfide, an alkenyl-functional compound, an alkynyl-functional compound, a hydroxy-functional compound, a combination thereof, or any other transition metal catalyst poison.

Suitable phosphines include trialkyl phosphines and triaryl phosphines such as triphenyl phosphine. Suitable diphosphines include tetraphenylethylene diphosphine. Suitable amines include n-butyl amine and triethanolamine. Suitable diamines include tetramethylenediamine. Suitable organic sulfides include ethyl phenyl sulfide. Suitable alkenyl-functional compounds can be organic, organosilicones, or organosilanes. Suitable alkenyl-functional compounds include vinylsiloxanes and vinylsilanes. Suitable alkynyl functional compounds can be organic, such as acetylene, propyne, 1-butyne, 1-pentyne, 4,4-dimethyl-1-pentyne, 1-hexyne, 5-methyl-1-hexyne, and 1-decyne.

Component E) is added in an amount sufficient to provide mechanical and chemical stability to the PCC for a period of at least 7 years when the PCC is to be used in a central processing unit (CPU) device. The amount of component E) can be at least 0.001%. The amount of component E) can be up to 1%.

Component F) is an optional matrix material that can be added in addition to component A) or instead of a portion of component A). Component F) can comprise a silicone resin. Without wishing to be bound by theory, it is thought that addition of a silicone resin would provide room temperature tack to the PCC, which may be advantageous for ease of application. Component F) can comprise a wax such as an organofunctional silicone wax that is compatible to some degree with the silicone-organic block copolymer.

Component G) is a vehicle such as a solvent or diluent. Component G) can be added during preparation of the PCC, for example, to aid mixing and delivery. All or a portion of component G) may optionally be removed after the PCC is prepared.

Component H) is a wetting agent.

Component I) is an antifoaming agent.

Component J) is a pigment.

Component K) is a flame retardant.

Component L) is a spacer. Spacers can comprise organic particles, inorganic particles, or a combination thereof. Spacers can be thermally conductive, electrically conductive, or both. Spacers can have a particle size of at least 25 micrometers up to 250 micrometers. Spacers can comprise monodisperse beads. The amount of component L) depends on various factors including the distribution of particles, pressure to be applied during placement, temperature of placement, and others. The PCC can contain up to 15%, alternatively up to 5% of component L) added in addition to, or instead of, a portion of component B).

Component M) is a low melting metal filler. The low melting metal filler can comprise In, Sn, or an alloy thereof. The low melting metal filler may optionally further comprise Ag, Bi, Cd, Cu, Ga, Pb, Sb, Zn, or a combination thereof. Examples of suitable low melting metal fillers include In—Bi—Sn alloys, Sn—In—Zn alloys, Sn—In—Ag alloys, Sn—Ag—Bi alloys, Sn—Bi—Cu—Ag alloys, Sn—Ag—Cu—Sb alloys, Sn—Ag—Cu alloys, Sn—Ag alloys, Sn—Ag—Cu—Zn alloys, and combinations thereof. The low melting metal filler can have a melting point higher than the melting point of the matrix. The low melting metal filler can have a melting point of up to 250° C., alternatively up to 225° C. The low melting metal filler can have a melting point of at least 50° C., alternatively at least 150° C. The low melting metal filler can be a eutectic alloy, a non-eutectic alloy, or a pure metal. Low melting metal fillers are known in the art and commercially available. Component M) can be added in addition to, or instead of, all or a portion of component B). The PCC may contain up to 96% of component M).

Method of Preparation of the PCC

Component A) is selected such that the PCC will be solid below its phase change temperature and deformable at or above the phase change temperature. The phase change temperature can be selected depending on various factors including the use of the PCC.

For example, the PCC can be used as a TIM in an electronic device. In this instance, the phase change temperature can be equal to or slightly less than the normal operating temperature for some electronic devices, e.g., at least 40° C., alternatively at least 45° C., alternatively at least 50° C., alternatively at least 55° C., alternatively at least 60° C. The normal operating temperature can be up to 80° C., alternatively up to 90° C., alternatively up to 100° C. Alternatively, the phase change temperature can be the maximum temperature the electronic devices can withstand, e.g., at least 150° C. up to 250° C. for some electronic devices.

The PCC can be formulated to have a thermal conductivity of at least 1 Watts per meter Kelvin (W/mK), alternatively at least 3 W/mK, alternatively at least 5 W/mK. Thermal conductivity depends on various factors including the amount and type of filler selected for component B).

The PCC can be prepared by any convenient means, such as mixing all components at a temperature higher than the phase change temperature. For example, for PCCs having a phase change temperature of up to 90° C., the PCC can be prepared by mixing all components at 100° C.

When component C) is present, the PCC may optionally be prepared by surface treating component B) with component C) and thereafter mixing the PCC at a temperature above the phase change temperature. Alternatively, component C) may be mixed with some or all of the other components simultaneously at a temperature above the phase change temperature.

When component G) is present, the PCC can be prepared by mixing all components at ambient or elevated temperature.

Methods of Use

The PCC described above can be used as an interface material, such as a thermal interface material (TIM). The interface material may have any convenient configuration, and one skilled in the art would be able to control the configuration by appropriate selection of component A), and other components. The PCC can be formulated to be form stable under ambient conditions. The PCC can be formulated to be self-supporting under ambient conditions. The PCC may optionally be provided as a flat member, such as a pad, tablet, sheet, or tape. Alternatively, the PCC may be provided as a hemispherical nubbin, a convex member, a pyramid, or a cone. The PCC may be formulated to be a tacky or tack-free solid under ambient conditions.

The PCC may optionally have a removable release sheet over a surface of the PCC. A release sheet can be used when the PCC is tacky at ambient conditions. The release sheet can be, for example, a wax- or silicone-coated paper or plastic sheet having a relatively low surface energy. The PCC may be applied to a face stock, liner, or other release sheet by any conventional means such as a direct process, e.g., spray-coating, knife-coating, roller coating, casting, drum coating, dipping or the like or an indirect transfer process using a release sheet. A solvent, diluent, or other vehicle may be added to the PCC before application, and thereafter the vehicle is removed to leave an adherent film, coating, or residue of the PCC on the release sheet.

The PCC may optionally be coated on a substrate, for example, when the PCC lacks sufficient form stability during processing. The substrate can be a thermally conductive material, an electrically conductive material, or both. The substrate can be, for example, a metal foil or perforated metal foil, such as gold, silver, copper, or aluminum foil; polyimide; polyamide; KAPTON® from E. I. Du Pont de Nemours and Company, Inc., of Wilmington, Del., U.S.A.; or polyethylene terephthalate polyester (MYLAR® from E. I. Du Pont de Nemours and Company, Inc., of Wilmington, Del., U.S.A.). The PCC can be coated on one or more surfaces of the substrate. Release sheets may be used on both sides of the coated substrate. This interface material is shown in FIG. 1. In FIG. 1, the interface material 100 comprises a substrate 101, and layers of the PCC described above 102 formed on opposing sides of the substrate 101. Release liners 103 are applied over the exposed surfaces of the PCC 102.

Various interface materials comprising the PCC described above can be prepared. The PCC described above can be used to prepare interface materials by various methods, including those disclosed in U.S. Pat. Nos. 4,299,715 and 5,904,796.

The PCC can be interposed along a thermal path between a heat source a heat spreader. The PCC can be interposed by any convenient means, such as applying a form stable PCC or interface material comprising the PCC between the heat source and the heat spreader with or without an adhesive or primer, hot-melt dispensing the PCC, or solvent casting the PCC.

The heat source can comprise an electronic component such as a semiconductor, a transistor, an integrated circuit, or a discrete device.

The heat spreader can comprise a heat sink, a thermally conductive plate, a thermally conductive cover, a fan, a circulating coolant system, a combination thereof, or others. The PCC can be used in direct contact with the electronic component and the heat sink. The PCC can be applied either to the electronic component and thereafter the heat sink, or the PCC can be applied to the heat sink and thereafter to the electronic component.

During or after interposing the PCC along the thermal path, the PCC can be heated to a temperature equal to or greater than the phase change temperature. Pressure may be applied. The PCC can then be cooled.

This invention further relates to a product comprising:
a) an electronic component,
b) an interface material, and
c) a heat sink;
where the interface material is arranged along a thermal path extending from a surface of the electronic component to a surface of the heat sink, where the interface material comprises the PCC described above.

This invention further relates to a product comprising:
a) a heat spreader, and
b) an interface material on a surface of the heat spreader, where the interface material and the heat spreader are configured to comprise a portion of a thermally conductive path between an electronic component and a heat sink, and where the interface material comprises the PCC described above.

Figure 2:
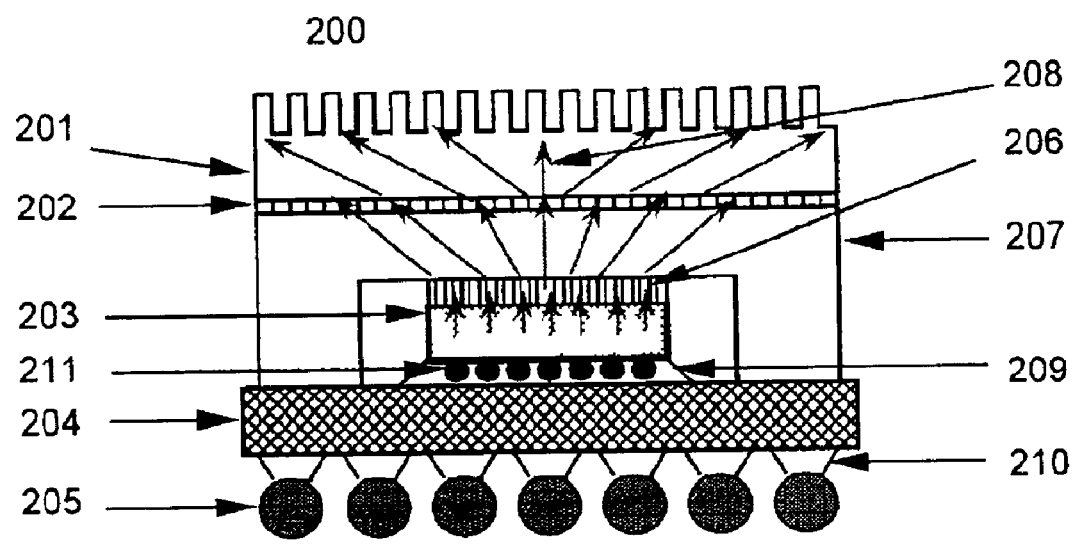
FIG. 2 is a device according to this invention.

FIG. 2 shows a device 200 according to this invention. The device 200 comprises an electronic component (shown as an integrated circuit (IC) chip) 203 mounted to a substrate 204 through a die attach adhesive 209 containing spacers 211. The substrate 204 has solder balls 205 attached thereto through pads 210. A first interface material (TIM1) 206 is interposed between the IC chip 203 and a metal cover 207. The metal cover 207 acts as a heat spreader. A second interface material (TIM2) 202 is interposed between the metal cover 207 and a heat sink 201. Heat moves along a thermal path represented by arrows 208 when the device is operated.

Products and devices may be prepared including the PCC described above. For example, the PCC described above may be used as the thermally conductive interface materials in the devices disclosed in U.S. Pat. Nos. 5,912,805; 5,930,893; 5,950,066; 6,054,198; and 6,286,212 in addition to, or instead of, the interface materials described therein.

Depending the chemical nature of the organic groups and the architecture of the silicone-organic block copolymer chain, the silicone-organic block copolymer may provide more than one phase change temperature to the PCC. PCCs with multiple phase change temperatures can be advantageous in providing resistance to pump-out at operating temperature of an electronic device in which the PCC is used as a TIM. For example, a silicone-organic block copolymer can be selected with at least two phase change temperatures, with two of the phase change temperatures being such that the operating temperature of an electronic component, such as an integrated circuit, is between the two phase change temperatures. A device as described above can be assembled at a temperature above the higher phase change temperature, where viscosity of the PCC is lowest and the PCC is most compliant. At the operating temperature, the PCC would be deemed semi-solid, thereby providing some degree of compliancy so that the PCC does not crack, delaminate, or transfer compressive pressure on the integrated circuit, but the PCC would still have stability against pump-out. Example 6 shows a silicone-organic block copolymer having more than one phase change temperature.

EXAMPLES

These examples are intended to illustrate the invention to one skilled in the art and should not be interpreted as limiting the scope of the invention set forth in the claims.

Reference Example 1

Mathis Hotdisk Method

Thermal conductivity measurement of the phase change materials is carried out on the Mathis Hotdisk equipment. Technical details of the method can be found in the instrument menu from the Mathis Instrument LTD. The technique can also be found in a publication by Craig Dixon, Michael Strong, and S. Mark Zhang, *Thermal Trends*, Vol. 7, No. 5, page 1.

Example 1

Silicone-Organic Block Copolymer Synthesis

Undecylenic acid (Cashem Corporation) is purified by vacuum distillation at 180–210° C. A 1000 milliliter (ml) round bottom flask equipped with a thermometer, electrical stirrer, nitrogen sweep, and a condenser is charged with 153.5 grams (g) of a solution of 70% hexamethylene diamine and 30% water (E. I. Du Pont de Nemours and Company, Inc., of Wilmington, Del., U.S.A.) and 346.5 g of the purified undecylenic acid. The flask is heated to 120° C. and is maintained at this temperature for about 1 hour. Next, the flask is heated to 160° C. to form the amide, with water generated as the reaction by-product. The reaction is allowed to continue at this temperature for 1 hour or until water is no longer detected in the condenser trap, indicating the reaction is complete. The flask is then heated to 220° C. for 1 hour and is further heated to 240° C. for 2 hours under vacuum with a low nitrogen purge to strip out impurities. The reaction mixture is then cooled and collected in an aluminum foil lined pan.

A 5000 ml three neck flask equipped with a thermometer, electrical stirrer and a condenser is charged with 2978.4 g of dimethylcyclosiloxanes, 21.52 g of tetramethyldihydrogen disiloxane and 1.4 g of trifluoromethane sulfonic acid. The flask is heated to 90° C. and is kept at this temperature for 4 hours. After 4 hours, 70 g of sodium bicarbonate is added. The heat is turned off, and the content of the flask is allowed to cool to room temperature and is mixed for 12 hours. The reaction mixture is filtered and transferred to a clean 5000 ml three neck flask equipped with a thermometer, electrical stirrer and a condenser. The flask is heated to 150° C. and is vacuum stripped. The level of functional SiH in the siloxane is then measured by infrared spectroscopy. The resulting product is 250 DP dimethylhydrogen endblocked polydimethylsiloxane. (DP means degree of polymerization.)

A 1000 ml, three neck, round bottom flask equipped with a temperature probe, an electrical stirrer, and a condenser is charged with 10 g of the amide formed as described above, 300 g xylene, and 0.107 g of 1,3-diethenyl-1,1,3,3-tetramethyldisiloxane platinum complex in dimethyl siloxane. The flask is heated to 115° C., and 294.93 g of 250 DP dimethylhydrogen endblocked polydimethyl siloxane is then added dropwise via an addition funnel. Following the addition, the reactants are mixed for 1 hour. The flask is then heated to 150° C. and is vacuum stripped to ensure removal of all residual solvent.

The resulting copolymer has number average molecular weight ($M_n$) of 50981 and weight average molecular weight ($M_w$) of 129,900 as measured by Gel Permeation Chromatography GPC (calibrated against polystyrene standards). Measurement of dynamic storage modulus (G'), dynamic loss modulus (G"), and complex viscosity (Eta*) as a function of temperature are obtained on an Advanced Rheometric Expansion System (ARES) Rheometer from Rheometric Scientific. At 30° C. the copolymer is a soft flexible solid with a G' and G" of $1.05 \times 10^6$ and $1.23 \times 10^5$ dynes/cm$^2$, respectively. The copolymer exhibits a phase transition temperature at 95° C., and the complex viscosity is measured in the melt state (120° C.) at 368 Poise.

Example 2

Forming a PCC with the Silicone-Organic Block Copolymer of Example 1

The copolymer of Example 1 is combined with $Al_2O_3$ filler (1:1 mixture of CB-A20S and Al-43-Me aluminum oxide fillers from Showa-Denko K.K.) by heating the copolymer and filler above 100° C. and centrifugal mixing.

A PCC is prepared with 88.2 weight % filler loading. Measurement on an ARES rheometer of the PCC indicates a softening transition temperature at about 85° C.

The PCC is fabricated between 2 release liner films in hot press at 150° C. to provide a flexible coherent film with a thickness of approximately 150 micrometers (6 mil). The change in bondline thickness is measured as a function of pressure between 2 silicon wafer substrates at 100° C. These results are shown below. These results indicate that the PCC is capable of flowing under light pressures at temperatures above the softening transition temperature.

TABLE 1

| Pressure (psi) | Bondline Thickness (micrometers) |
|---|---|
| 0.29 | 165 |
| 1.64 | 136 |
| 3.90 | 113 |
| 7.76 | 81 |
| 11.98 | 33 |

Examples 3 and 4

PCCs with Different Filler Loading

PCCs are prepared as in Example 2, except that different filler loadings are used. Thermal conductivity is measured as a function of filler loading on the Mathis Hot Disk equipment according to the method of Reference Example 1. The results are in Table 2 below.

TABLE 2

| Temperature (° C.) | Example 3 Thermal Conductivity (W/m ° K) 60 vol % filler | Example 4 Thermal Conductivity (W/m ° K) 65 vol % filler |
|---|---|---|
| 25 | 2.14 | 2.46 |
| 40 | 1.97 | 2.53 |
| 60 | 1.88 | 2.40 |
| 80 | 1.92 | 2.10 |
| 100 | 1.75 | 2.02 |
| 120 | 1.64 | 2.01 |

60 and 65 vol. % correspond to 85.6 and 88.1 weight % filler loading, respectively.
W/m ° K means Watts per meter-Kelvin.

Example 5

Silicone-Organic Block Copolymer Synthesis

Undecylenic acid (Cashem Corporation) is purified by vacuum distillation at 180–210° C. A 500 milliliter (ml) round bottom flask equipped with a thermometer, electrical stirrer, nitrogen sweep, and a condenser is charged with 46.8 grams (g) of 2-methyl-1,5 pentane diamine (Dupont Dytec A Amine purchased through Aldrich) and 150.1 g of purified undecylenic acid. The flask is heated to 120° C. and is maintained at this temperature for about 1 hour. Next, the material is heated to 180° C., and the amide is produced with water as the reaction by-product. The reaction is allowed to continue at this temperature for 1 hour or until water is no longer detected in the condenser trap indicating the reaction is complete. The flask is then heated to 220° C. for 2 hours and is further heated to 240° C. for 2 hours under vacuum with a low nitrogen purge to strip out impurities. The reaction mixture is then cooled and is collected in an aluminum foil lined pan.

A 500 ml, three neck, round bottom flask equipped with a temperature probe, an electrical stirrer, and a condenser is charged with 10 g of the amide formed as described above, 200 g toluene, and 0.2 g 1,3-diethenyl-1,1,3,3-tetramethyldisiloxane platinum complex in dimethyl siloxane. The flask is heated to 115° C. and 176.3 g of 250 DP dimethylhydrogen endblocked polydimethylsiloxane (as in Example 1) is then added drop-wise via an addition funnel. Following the addition, the reactants are further allowed to mix for 1 hour. The flask is then heated to 150° C. and vacuum stripped to ensure removal of all residual solvent The resulting copolymer has $M_n$ of 17380 and $M_w$ of 56970 as measured by gel permeation chromatograph (GPC). A dynamic temperature ramp test of the copolymer on an ARES Rheometer reveals a phase transition temperature of about 45° C. At 30° C. the copolymer is a flexible solid with a G' and G" of $3.23 \times 10^6$ and $5.78 \times 10^5$ dynes/cm$^2$, respectively. The melt viscosity at 120° C. is 19 Poise.

Example 6

Silicone-Organic Block Copolymer Synthesis

A 1000 ml, three neck, round bottom flask equipped with a temperature probe, an electrical stirrer, and a condenser is charged with 1.26 g of the amide described in Example 1 and 3.76 g of amide described in Example 5, 100 g toluene, and 0.24 g 1,3-diethenyl-1,1,3,3-tetramethyldisiloxane platinum complex in dimethyl siloxane. The flask is heated to 115° C. and 88.28 g 250 DP dimethylhydrogen endblocked polydimethylsiloxane (as in Example 1) is added drop-wise via an addition funnel. Following the addition, the reactants are further allowed to mix for 1 hour. The flask is then heated to 150° C. and vacuum stripped to ensure removal of all residual solvent. The resulting polymer has $M_n$ of 20080 and $M_w$ of 51190 as measured by GPC (calibrated against polystyrene standards).

A temperature-viscosity sweep of the copolymer on an ARES Rheometer provides two phase transition temperature at 45 and 85° C. At 30° C. the copolymer is a flexible solid with a measured G' and G" of $3.93 \times 10^6$ and $6.58 \times 10^5$ dynes/cm$^2$, respectively. Above the phase transition temperature, the melt viscosity at 120° C. is 29 Poise.

Example 7

Preparation of a Silicone-Amide Block Copolymer of Formula II

Undecylenic acid (Cashem Corporation) is purified by vacuum distillation at 180–210° C. A 500 milliliter (ml) round bottom flask equipped with a thermometer, electrical stirrer, nitrogen sweep, and a condenser is charged with 40 grams (g) of 2-methyl-1,5 pentane diamine (Dupont Dytec A Amine purchased through Aldrich) and is purged for about 5 minutes to remove any oxygen in the headspace. With the stirring off, 10.10 g of adipic acid (Dupont, Adipure Grade) is added. The electrical stirrer is then turned on, and the mixture turns to a light yellow color. Next, 101.53 g of the purified undecylenic acid is slowly added to the reaction mixture. The flask is heated to 135° C. and is maintained at this temperature for about 1 hour. Next, the material is heated to 170° C., and the amide is produced with water as the reaction by-product. The flask is then heated to 220° C. for 2 hours and is further heated to 240° C. for 2 hours under vacuum with a low nitrogen purge to strip out impurities. The reaction mixture is then cooled and is collected in an aluminum foil lined pan.

A 1000 ml, three neck, round bottom flask equipped with a temperature probe, an electrical stirrer, and a condenser is charged with 5.09 g of the amide formed as described above, 100.75 g toluene, and 0.4 g 1,3-diethenyl-1,1,3,3-tetramethyldisiloxane platinum complex in dimethyl siloxane. The flask is heated to 115° C. and 96.46 g of 250 DP dimethylhydrogen endblocked polydimethylsiloxane (as in Example 1) is then added drop-wise via an addition funnel. Following the addition, the reactants are mixed for 1 hour. The flask is then heated to 150° C. and vacuum stripped to ensure removal of all residual solvent.

The resulting silicone-amide block copolymer has $M_n$ of 21,270 and $M_w$ of 64,360 as measured by gel permeation chromatograph (GPC). A dynamic temperature ramp test of the copolymer on an ARES Rheometer reveals a phase change temperature of 67° C. At 30° C. the copolymer is a flexible solid with a G' and G" of $1.63 \times 10^6$ and $5.30 \times 10^5$ dynes/cm$^2$, respectively. The melt viscosity at 120° C. is 63 Poise.

We claim:

1. A composition comprising:
   A) a matrix comprising a silicone-organic block copolymer,
   B) a thermally conductive filler,
   optionally C) a treating agent comprising an alkoxysilane having the formula: $R^5{}_x Si(OR^6)_{(4-x)}$, where
   $R^5$ is a substituted or unsubstituted monovalent hydrocarbon group of at least 1 carbon atom to 50 carbon atoms,
   each $R^6$ is independently an unsubstituted, saturated hydrocarbon group of at least 1 carbon atom up to 4 carbon atoms, and
   x is 1, 2, or 3; and
   optionally D) an antioxidant;

wherein component A) comprises a silicone-organic block copolymer selected from the group consisting of a first silicone-organic block copolymer and a second silicone-organic block copolymer, where the first silicone-organic block copolymer comprises units of the formula

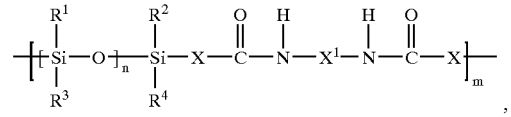

and the second silicone-organic block copolymer comprises units of the formula

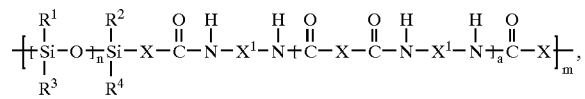

where n is at least 1 up to 700, m is at least 1 up to 300, a is at least 1 up to 60, X is a divalent hydrocarbon group, $X^1$ is a divalent organic group, and each of $R^1$, $R^2$, $R^3$, $R^4$ is independently methyl, ethyl, propyl, isopropyl, a chain comprising siloxane, and phenyl, wherein the phenyl may optionally be substituted by 1 to 3 members independently selected from methyl and ethyl.

2. The composition of claim 1, wherein the composition has a phase change temperature of at least 40° C.

3. The composition of claim 1, where in the first silicone-organic block copolymer:

n is at least 10 up to 500;

m is at least 1 up to 300;

X has at least 1 up to 30 carbon atoms;

$X^1$ is a substituted or unsubstituted divalent hydrocarbon group of at least 1 carbon atom up to 40 carbon atoms;

and each of $R^1$, $R^2$, $R^3$, $R^4$ is independently methyl or ethyl.

4. The composition of claim 1, where in the second silicone-organic block copolymer:

n is at least 10 up to 500;

m is at least 50 up to 300;

X has at least 1 carbon atom up to 30 carbon atoms;

$X^1$ is a substituted or unsubstituted divalent hydrocarbon group of at least 1 carbon atom up to 40 carbon atoms; and each of $R^1$, $R^2$, $R^3$, $R^4$ is independently methyl or ethyl.

5. The composition of claim 1, where component B) is electrically conductive.

6. The composition of claim 1, where component B) is electrically insulating.

7. The composition of claim 1, where component B) comprises aluminum nitride, aluminum oxide, barium titinate, beryllium oxide, boron nitride, diamond, graphite, magnesium oxide, metal particulate, silicon carbide, tungsten carbide, zinc oxide, or a combination thereof.

8. The composition of claim 1, where component D) is present and comprises a phenolic antioxidant or a combination of a phenolic antioxidant and a stabilizer.

9. The composition of claim 1, further comprising an optional component comprising E) a catalyst inhibitor, F) a silicone resin, a silicone wax, or a combination thereof; (G) a vehicle; H) a wetting agent; I) an antifoaming agent; J) a pigment; K) a flame retardant; L) a spacer; M) a low melting metal filler, N) a reinforcing filler; or a combination thereof.

10. An interface material comprising I) the composition of claim 1, where the composition is formed as a flat member, a hemispherical nubbin, a convex member, a pyramid, or a cone.

11. The interface material of claim 10, further comprising II) a release sheet, where the release sheet covers a surface of the composition.

12. The interface material of claim 10, where the composition is coated on a surface of a substrate.

13. The interface material of claim 12, where the substrate comprises a metal foil, a polyamide sheet, a polyimide sheet, or a polyethylene terephthalate polyester sheet.

14. The interface material of claim 13, where the composition is coated on two sides of the substrate.

15. The interface material of claim 14, further comprising II) a release sheet covering a surface of the composition opposite the substrate.

16. A method comprising interposing the interface material of claim 10 along a thermal path between a heat source and a heat spreader, where
   a) the interface material has first phase change temperature and a second phase change temperature, and
   b) the heat source has a normal operating temperature lower than the first phase change temperature and higher than the second phase change temperature.

17. The method of claim 16, where the heat source comprises an electronic component.

18. A method comprising:
   i) interposing the composition of claim 1 along a thermal path between a heat source and a heat spreader.

19. The method of claim 18, wherein the heat source comprises an electronic component.

20. The method of claim 18, where the heat spreader comprises a heat sink, a thermally conductive plate, a thermally conductive cover, a fan, or a circulating coolant system.

21. The method of claim 18, further comprising:
   ii) heating the composition to a temperature equal to or greater than phase change temperature of the composition, and
   iii) applying pressure to the composition.

22. The method of claim 21, further comprising:
   iv) cooling the composition to a temperature less than the phase change temperature.

23. A device comprising:
   a) an electronic component,
   b) an interface material, and
   c) a heat sink;
   where the interface material is arranged along a thermal path extending from a surface of the electronic component to a surface of the heat sink, where the interface material comprises the composition of claim 1.

24. A device comprising:
   a) a heat spreader, and
   b) an interface material on a surface of the heat spreader,
   where the interface material and the heat spreader are configured to comprise a portion of a thermally conductive path between an electronic component and a heat sink, and where the interface material comprises the composition of claim 1.

25. A copolymer comprising units of formula:

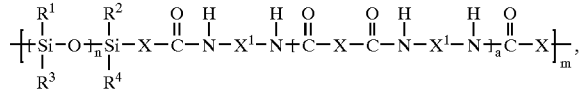

where
   n is at least 1 up to 700,
   m is at least 1 up to 300,
   a is at least 1 up to 60,
   X is a divalent hydrocarbon group,
   $X^1$ is a divalent organic group, and
   each of $R^1$, $R^2$, $R^3$, $R^4$ is independently methyl, ethyl, propyl, isopropyl, a halogenated alkyl group, a chain comprising siloxane, and phenyl, where the phenyl may optionally be substituted by 1 to 3 members independently selected from methyl and ethyl.

26. The copolymer of claim 25, where:
   n is at least 10 up to 500;
   m is at least 1 up to 200;
   X has at least 1 carbon atom up to 30 carbon atoms;
   $X^1$ is a substituted or unsubstituted divalent hydrocarbon group of at least 1 carbon atom up to 40 carbon atoms; and
   each of $R^1$, $R^2$, $R^3$, $R^4$ is independently methyl or ethyl.

* * * * *